(12) United States Patent
Kitai et al.

(10) Patent No.: US 8,715,526 B2
(45) Date of Patent: May 6, 2014

(54) FULLY-AROMATIC THERMOTROPIC LIQUID CRYSTAL POLYESTER RESIN COMPOSITION, MOLDED OBJECT, AND LED REFLECTOR

(75) Inventors: Toru Kitai, Tokyo (JP); Toshio Nakayama, Tokyo (JP); Satoshi Murouchi, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 13/583,763

(22) PCT Filed: Mar. 14, 2011

(86) PCT No.: PCT/JP2011/055910
§ 371 (c)(1),
(2), (4) Date: Nov. 20, 2012

(87) PCT Pub. No.: WO2011/115043
PCT Pub. Date: Sep. 22, 2011

(65) Prior Publication Data
US 2013/0056681 A1    Mar. 7, 2013

(30) Foreign Application Priority Data

Mar. 16, 2010 (JP) ................................ P2010-059658
Mar. 16, 2010 (JP) ................................ P2010-059676

(51) Int. Cl.
| | | |
|---|---|---|
| C09K 19/38 | (2006.01) | |
| C09K 19/54 | (2006.01) | |
| C08K 3/22 | (2006.01) | |
| C08G 63/60 | (2006.01) | |
| H01L 33/60 | (2010.01) | |
| G02B 5/12 | (2006.01) | |
| C09K 19/52 | (2006.01) | |
| G02B 5/30 | (2006.01) | |

(52) U.S. Cl.
CPC ....... C09K 19/3809 (2013.01); C09K 2019/521 (2013.01); C08K 3/22 (2013.01); C08K 2003/2237 (2013.01); G02B 5/12 (2013.01); G02B 5/30 (2013.01); C08G 63/605 (2013.01)
USPC .............. 252/299.01; 252/299.5; 252/299.67; 428/1.1

(58) Field of Classification Search
CPC .................... C09K 19/3809; C09K 2019/521; C08K 3/22; C08K 2003/2237; C08G 63/605; G02B 5/12; G02B 5/30; H01L 33/60
USPC ........................... 252/299.01, 299.54, 299.67
See application file for complete search history.

(56) References Cited

U.S. PATENT DOCUMENTS

| | | | | |
|---|---|---|---|---|
| 7,713,439 | B2 * | 5/2010 | Murouchi et al. | ........ 252/299.01 |
| 7,914,699 | B2 * | 3/2011 | Tachikawa et al. | ...... 252/299.01 |
| 8,545,718 | B2 * | 10/2013 | Nakayama et al. | ...... 252/299.01 |
| 8,545,719 | B2 * | 10/2013 | Komatsu et al. | ......... 252/299.01 |
| 2001/0014708 | A1 | 8/2001 | Murouchi et al. | |
| 2004/0165390 | A1 | 8/2004 | Sato et al. | |
| 2007/0243376 | A1 * | 10/2007 | Tachikawa et al. | ........... 428/364 |
| 2009/0163106 | A1 * | 6/2009 | Kohinata et al. | .............. 442/414 |
| 2009/0250662 | A1 | 10/2009 | Murouchi et al. | |
| 2010/0053972 | A1 * | 3/2010 | Nakayama | ............... 362/296.01 |
| 2011/0018421 | A1 | 1/2011 | Saito et al. | |
| 2012/0097894 | A1 | 4/2012 | Nakayama et al. | |
| 2012/0104315 | A1 * | 5/2012 | Fukuhara et al. | ........... 252/299.5 |
| 2012/0232188 | A1 * | 9/2012 | Nakayama | ..................... 523/219 |
| 2012/0235089 | A1 * | 9/2012 | Nakayama et al. | ........ 252/299.5 |
| 2012/0235559 | A1 * | 9/2012 | Nakayama et al. | ........... 313/498 |
| 2013/0030143 | A1 * | 1/2013 | Saito | ............................. 528/274 |

FOREIGN PATENT DOCUMENTS

| | | |
|---|---|---|
| JP | 6-38520 | 5/1994 |
| JP | 2000-345015 | 12/2000 |
| JP | 2004-256673 | 9/2004 |
| JP | 2004-277539 | 10/2004 |

(Continued)

OTHER PUBLICATIONS

International Search Report issued with respect to PCT/JP2011/055910, mailed Apr. 12, 2011.

(Continued)

*Primary Examiner* — Shean C Wu
(74) *Attorney, Agent, or Firm* — Greenblum & Bernstein, P.L.C.

(57) ABSTRACT

The fully-aromatic thermotropic liquid crystal polyester resin composition of the present invention comprises 100 parts by mass of a fully-aromatic thermotropic liquid crystal polyester; and 50 to 150 parts by mass of titanium oxide, wherein the fully-aromatic thermotropic liquid crystal polyester comprises a repeating structural unit represented by the following formula (1), a repeating structural unit represented by the following formula (2), and a repeating structural unit represented by the following formula (3), and comprises 65 mole % to 78 mole % of the repeating structural unit represented by the formula (1).

[Chemical Formula 1]

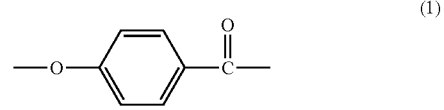

(1)

[Chemical Formula 2]

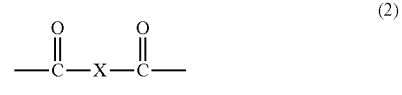

(2)

[Chemical Formula 3]

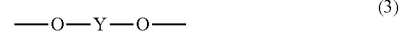

(3)

wherein X and Y each represent a divalent group having an aromatic ring.

13 Claims, No Drawings

(56) References Cited

FOREIGN PATENT DOCUMENTS

| JP | 2007-99786 | 4/2007 |
|----|------------|--------|
| JP | 2007-254620 | 10/2007 |
| JP | 2007-254669 | 10/2007 |
| JP | 2009-256627 | 11/2009 |
| JP | 2010-138228 | 6/2010 |
| WO | 2010/113543 | 10/2010 |

OTHER PUBLICATIONS

English-translation of International Preliminary Report on Patentability issued with respect to PCT/JP2011/055910, mailed Nov. 1, 2012.

* cited by examiner

FULLY-AROMATIC THERMOTROPIC LIQUID CRYSTAL POLYESTER RESIN COMPOSITION, MOLDED OBJECT, AND LED REFLECTOR

TECHNICAL FIELD

The present invention relates to a fully-aromatic thermotropic liquid crystal polyester resin composition, and a molded object and an LED reflector thereof.

BACKGROUND ART

In an LED (light-emitting diode) light-emitting apparatus, a reflector (white reflective frame) is provided around an LED device in order to increase the light utilization rate of the LED. As molding materials for LED reflectors, various liquid crystal polyester resin compositions in which a liquid crystal polyester excellent in heat resistance and a white pigment, such as titanium oxide, are blended have been proposed (for example, see the following Patent Literatures 1 to 5).

CITATION LIST

Patent Literature

Patent Literature 1: Japanese Examined Patent Application Publication No. 06-38520
Patent Literature 2: Japanese Patent Application Laid-Open Publication No. 2004-256673
Patent Literature 3: Japanese Patent Application Laid-Open Publication No. 2004-277539
Patent Literature 4: Japanese Patent Application Laid-Open Publication No. 2007-254669
Patent Literature 5: Japanese Patent Application Laid-Open Publication No. 2009-256627

SUMMARY OF INVENTION

Technical Problem

But, a problem of LED reflectors formed of the above conventional liquid crystal polyester resin compositions is that a reflector surface is easily discolored by the light of the LED, and thus, the light reflectance of the reflector decreases, and LED brightness decrease (decrease in light extraction efficiency) occurs.

In recent years, the power of LEDs has increased, and there has been a tendency that light energy that reflectors receive increases. Therefore, for LED reflectors formed of liquid crystal polyester resin compositions, there is a possibility that the above discoloration problem becomes serious.

The present invention has been made in view of the above circumstances, and it is an object of the present invention to provide a fully-aromatic thermotropic liquid crystal polyester resin composition that can produce a molded object which has sufficient light reflectance and in which discoloration due to light is little and light reflectance is less likely to decrease, and a molded object and an LED reflector thereof.

Solution to Problem

In order to solve the above problem, the present inventors have studied diligently, and, as a result, found that a resin composition comprising a fully-aromatic thermotropic liquid crystal polyester containing p-hydroxybenzoic acid (HBA) as a constituent and having a particular repeating structural unit, and titanium oxide particles in a particular amount with respect to this liquid crystal polyester, in which the content of the above HBA in the liquid crystal polyester is set in a particular range, can form a molded object having sufficient light reflectance, and in the molded object, a decrease in light reflectance is smaller than that of conventional ones also after a predetermined light irradiation test. In addition, the present inventors have also found that in a resin composition comprising a fully-aromatic thermotropic liquid crystal polyester obtained by reacting the above BBA, a dicarboxylic acid compound, and a diol compound, and titanium oxide particles in a particular amount with respect to this liquid crystal polyester, by setting the content of the above HBA in the liquid crystal polyester in a particular range and further containing a particular amount of a particular diol compound in the liquid crystal polyester, a molded object having sufficient light reflectance can be formed, and in the molded object, a decrease in light reflectance is smaller than that of conventional ones also after a predetermined light irradiation test. Based on these findings, the present inventors have completed the present invention.

The fully-aromatic thermotropic liquid crystal polyester resin composition of the present invention comprises 100 parts by mass of a fully-aromatic thermotropic liquid crystal polyester; and 50 to 150 parts by mass of titanium oxide, wherein the fully-aromatic thermotropic liquid crystal polyester comprises a repeating structural unit represented by the following formula (1), a repeating structural unit represented by the following formula (2), and a repeating structural unit represented by the following formula (3), and comprises 65 mole % to 78 mole % of the repeating structural unit represented by the formula (1).

[Chemical Formula 1]

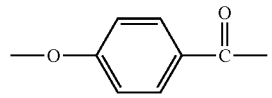
(1)

[Chemical Formula 2]

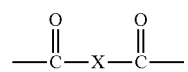
(2)

[Chemical Formula 3]

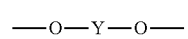
(3)

wherein X and Y each represent a divalent group having an aromatic ring.

According to the fully-aromatic thermotropic liquid crystal polyester resin composition of the present invention, by having the above configuration, a molded object which has sufficient light reflectance and in which discoloration due to light is little and light reflectance is less likely to decrease can be obtained. The present inventors consider that a reason why such an effect is obtained is that by setting the content of the structural unit represented by the above formula (1) to the above lower limit value or more, the content of the structural units represented by the above formulas (2) and (3) that are considered to be a cause of discoloration due to light irradiation can be set relatively small, and on the other hand, by setting the content of the structural unit represented by the above formula (1) to the above upper limit value or less, the compounding and molding processing, such as injection molding, of the composition are sufficiently possible.

In terms of ensuring the strength, durability, solder heat resistance, and the like of a molded object, a resin composition is required to have sufficiently high mechanical properties, such as flexural modulus, and distortion temperature under load (DTUL), and particularly, in order to ensure heat resistance capable of withstanding solder reflow, the DTUL is preferably 200° C. or more, further preferably 220° C. or more, and the fully-aromatic thermotropic liquid crystal polyester resin composition of the present invention can have such heat resistance and mechanical properties.

In the fully-aromatic thermotropic liquid crystal polyester resin composition of the present invention, discoloration is less likely to proceed also for light where wavelength is 480 nm, and the fully-aromatic thermotropic liquid crystal polyester resin composition of the present invention can have excellent heat resistance capable of withstanding solder reflow, and is preferable, for example, as a material for forming a reflector used for a white LED having a high power of 1 W or more.

In terms of heat resistance and molding processability, it is preferable that the repeating structural unit represented by the above formula (2) is a residue of terephthalic acid and/or isophthalic acid, and the repeating structural unit represented by the above formula (3) is a residue of 4,4'-dihydroxybiphenyl.

It is preferable that the fully-aromatic thermotropic liquid crystal polyester resin composition of the present invention comprises at least 0.5 mole % to 17.5 mole % of a repeating structural unit represented by the following formula (3-1) as the repeating structural unit represented by the above formula (3).

[Chemical Formula 4]

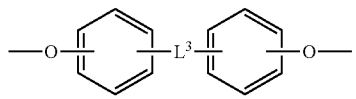
(3-1)

wherein $L^3$ represents a divalent hydrocarbon group, —SO$_2$—, or —CO—.

According to this fully-aromatic thermotropic liquid crystal polyester resin composition, by having the above configuration, a molded object which has sufficient light reflectance and in which discoloration due to light is little and light reflectance is less likely to decrease can be obtained. The present inventors consider that a reason why such an effect is obtained is that by setting the content of the structural unit represented by the above formula (1) in the above range and setting the structural unit represented by the above formula (3-1) in the above range, the content of the structural unit that is considered to be a cause of discoloration due to light irradiation, of the structural units represented by the above formulas (2) and (3), can be set relatively small while the compounding and molding processing, such as injection molding, of the composition are made sufficiently possible.

In addition, in terms of heat resistance and molding processability, it is preferable that the above fully-aromatic thermotropic liquid crystal polyester comprises at least 5 mole % to 17.5 mole % of a repeating structural unit represented by the following formula (2-1) as the repeating structural unit represented by the above formula (2).

[Chemical Formula 5]

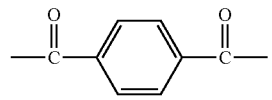
(2-1)

In addition, in terms of heat resistance and molding processability, it is preferable that the above fully-aromatic thermotropic liquid crystal polyester further comprises 2.5 mole % to 17 mole % of a repeating structural unit represented by the following formula (3-2) as the repeating structural unit represented by the above formula (3).

[Chemical Formula 6]

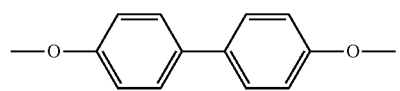
(3-2)

Further, in terms of further reducing the discoloration of a molded article surface due to light irradiation, it is preferable that the above fully-aromatic thermotropic liquid crystal polyester comprises at least 0.5 mole % to 15 mole % of a repeating structural unit represented by the following formula (3-3) and 2.5 mole % to 17 mole % of a repeating structural unit represented by the following formula (3-2) as the repeating structural unit represented by the above formula (3).

[Chemical Formula 7]

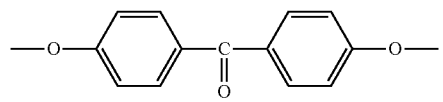
(3-3)

[Chemical Formula 8]

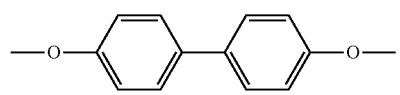
(3-2)

In addition, it is preferable that the fully-aromatic thermotropic liquid crystal polyester of the present invention is obtained by two-stage polymerization of melt polycondensation and solid phase polycondensation. In this case, it is easy to obtain a molded object that is excellent in heat resistance and can withstand solder reflow.

Further, in terms of heat resistance and molding processability, it is preferable that the fully-aromatic thermotropic liquid crystal polyester of the present invention has a melting point of 300° C. or more and 380° C. or less.

In addition, in terms of heat resistance and molding processability, it is preferable that the fully-aromatic thermotropic liquid crystal polyester resin composition of the present invention has a complete melting temperature of 300° C. or more and 380° C. or less.

The present invention also provides a molded object comprising the fully-aromatic thermotropic liquid crystal polyester resin composition of the present invention described above. The molded object of the present invention can have optical properties which provide sufficient light reflectance and in which discoloration due to light is little and light reflectance is less likely to decrease, and excellent heat resistance and excellent mechanical properties. It is preferable that the molded object of the present invention has a DTUL of 220° C. or more in terms of ensuring heat resistance capable of withstanding solder reflow.

The present invention also provides an LED reflector comprising the fully-aromatic thermotropic liquid crystal polyester resin composition of the present invention described above. The LED reflector of the present invention can have optical properties which provide sufficient light reflectance and in which discoloration due to light is little and light reflectance is less likely to decrease, and excellent heat resistance and excellent mechanical properties.

Advantageous Effects of Invention

According to the present invention, it is possible to provide a fully-aromatic thermotropic liquid crystal polyester resin composition that can produce a molded object which has sufficient light reflectance and in which discoloration due to light is little and light reflectance is less likely to decrease, and a molded object and an LED reflector thereof.

DESCRIPTION OF EMBODIMENTS

The first embodiment of the fully-aromatic thermotropic liquid crystal polyester (hereinafter sometimes simply abbreviated as "LCP") of the present invention comprises a repeating structural unit represented by the following formula (1), a repeating structural unit represented by the following formula (2), and a repeating structural unit represented by the following formula (3), and comprises 65 mole % to 78 mole % of the repeating structural unit represented by the following formula (1). In the LCP according to the present invention, 11 mole % to 17.5 mole % of the repeating structural unit represented by formula (2) is contained in total, and 11 mole % to 17.5 mole % of the repeating structural unit represented by formula (3) is contained in total.

[Chemical Formula 9]

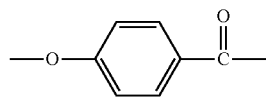

(1)

[Chemical Formula 10]

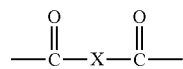

(2)

[Chemical Formula 11]

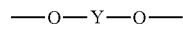

(3)

wherein X and Y each represent a divalent group having an aromatic ring.

In addition, the second embodiment of the LCP of the present invention comprises 65 mole % to 78 mole % of the repeating structural unit represented by the above formula (1), 11 mole % to 17.5 mole % of the repeating structural unit represented by the above formula (2) in total, and 11 mole % to 17.5 mole % of the repeating structural unit represented by the above formula (3) in total, and comprises at least 0.5 mole % to 17.5 mole % of a repeating structural unit represented by the following formula (3-1) as the repeating structural unit represented by the above formula (3).

[Chemical Formula 12]

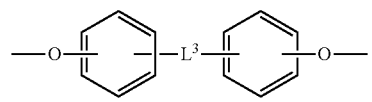

(3-1)

wherein $L^3$ represents a divalent hydrocarbon group, $-SO_2-$, or $-CO-$.

Examples of the divalent hydrocarbon group include alkanediyl groups having 1 to 3 carbon atoms, and among them, $-C(CH_3)_2-$ or $-CH(CH_3)-$ is preferable. Two bonds of a benzene ring in formula (3-1) are in a meta or para relationship.

In the LCP according to the present invention, the structural unit represented by formula (2) may be one or two or more. In addition, in the LCP according to the present invention, the structural unit represented by formula (3) may be one or two or more. In addition, in the LCP according to the present invention, the content of the repeating structural unit represented by formula (1), the repeating structural unit represented by formula (2), and the repeating structural unit represented by formula (3) can be set so that their total is 100 mole %, and the content of the structural unit of formula (2) and the content of the structural unit of formula (3) are equal.

Examples of the structural units represented by the above formulas (2) and (3) include structural units represented by the following formulas (2-A) and (3-A), respectively.

[Chemical Formula 13]

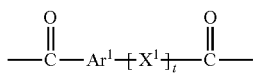

(2-A)

[Chemical Formula 14]

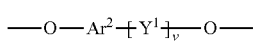

(3-A)

wherein $Ar^1$ and $Ar^2$ each represent a divalent aromatic group, $X^1$ and $Y^1$ each represent a divalent group having an aromatic ring, and t and v each represent an integer of 0 or 1.

As $Ar^1$ and $Ar^2$, a divalent aromatic group represented by the following formula (4) or (5) is preferable in terms of heat resistance and molding processability. Two bonds of a benzene ring represented by formula (4) are in a meta or para relationship.

[Chemical Formula 15]

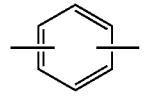

(4)

[Chemical Formula 16]

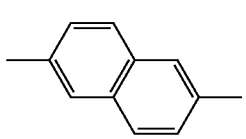

(5)

Examples of $X^1$ include divalent groups represented by the following formula (6).

[Chemical Formula 17]

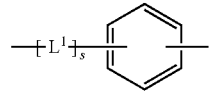
(6)

wherein $L^1$ represents a divalent hydrocarbon group, —O—, —S—, —SO—, —SO$_2$—, or —CO—, and s represents an integer of 0 or 1. Examples of the divalent hydrocarbon group include alkanediyl groups having 1 to 3 carbon atoms, and among them, —C(CH$_3$)$_2$— or —CH(CH$_3$)— is preferable. Two bonds of a benzene ring in formula (6) are in a meta or para relationship.

Examples of $Y^1$ include divalent groups represented by the following formula (7).

[Chemical Formula 18]

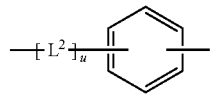
(7)

wherein $L^2$ represents a divalent hydrocarbon group, —O—, —S—, —SO—, —SO$_2$—, or —CO—, and u represents an integer of 0 or 1. Two bonds of a benzene ring in formula (7) are in a meta or para relationship.

The first embodiment of the LCP according to the present invention can be obtained, for example, by copolymerizing p-hydroxybenzoic acid, an aromatic dicarboxylic acid, and an aromatic dihydroxy compound. A monomer ratio at this time is set so that the repeating structural unit represented by the above formula (1) in the LCP is 65 mole % to 78 mole %.

The content of the repeating structural unit represented by the above formula (1) is preferably 65 mole % to 74 mole % in terms of heat resistance and molding processability, and is more preferably 67 mole % to 74 mole % in that discoloration can be further suppressed.

Examples of the aromatic dicarboxylic acid include terephthalic acid, isophthalic acid, 2,6-naphthalenedicarboxylic acid, 4,4'-biphenyldicarboxylic acid, and benzophenone-4,4'-dicarboxylic acid. One of these can be used alone, or two or more of these can be used in combination.

In the first embodiment of the LCP according to the present invention, it is preferable to copolymerize terephthalic acid so that 5 mole % to 15 mole % of terephthalic acid is contained in the LCP, in terms of heat resistance and molding processability.

Examples of the aromatic dihydroxy compound include hydroquinone, 4,4'-dihydroxybiphenyl, and 2,6-naphthalenediol. One of these can be used alone, or two or more of these can be used in combination.

In the first embodiment of the LCP according to the present invention, it is preferable to copolymerize 4,4'-dihydroxybiphenyl so that 5 mole % to 17 mole % of 4,4'-dihydroxybiphenyl is contained, in terms of heat resistance and molding processability.

In addition, it is preferable that in the first embodiment of the LCP according to the present invention, the repeating structural unit represented by the above formula (2) is a residue of terephthalic acid and/or isophthalic acid, and the repeating structural unit represented by the above formula (3) is a residue of 4,4'-dihydroxybiphenyl, in terms of heat resistance and molding processability.

In the second embodiment of the LCP according to the present invention, the structural unit represented by the above formula (3-1), that is, a structural unit in which $Ar^2$ in the above formula (3-A) is the divalent aromatic group represented by the above formula (4), v is 1, and $Y^1$ is the divalent group represented by the above formula (7), and u in the above formula (7) is 1, and $L^2$ is a divalent hydrocarbon group, —SO$_2$—, or —CO—, is contained as an essential structural unit.

It is preferable that the second embodiment of the LCP according to the present invention comprises at least 5 mole % to 17.5 mole % of a repeating structural unit represented by the following formula (2-1) as the repeating structural unit represented by the above formula (2), in terms of heat resistance and molding processability. This structural unit can be introduced into the LCP by using terephthalic acid as a copolymerization monomer for preparing LCP.

[Chemical Formula 19]

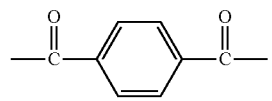
(2-1)

In addition, it is preferable that the second embodiment of the LCP according to the present invention further comprises 2.5 mole % to 17 mole % of a repeating structural unit represented by the following formula (3-2) as the repeating structural unit represented by the above formula (3), in terms of heat resistance and molding processability. This structural unit can be introduced into the LCP by using 4,4'-biphenol as a copolymerization monomer for preparing LCP.

[Chemical Formula 20]

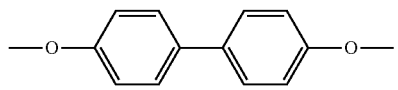
(3-2)

Further, it is preferable that in the second embodiment of the LCP according to the present invention, the above fully-aromatic thermotropic liquid crystal polyester comprises at least 0.5 mole % to 15 mole % of a repeating structural unit represented by the following formula (3-3) and 2.5 mole % to 17 mole % of a repeating structural unit represented by the following formula (3-2) as the repeating structural unit represented by the above formula (3), in terms of further reducing the discoloration of a molded article surface due to light irradiation. These structural units can be introduced into the LCP by using 4,4'-dihydroxybenzophenone and 4,4'-biphenol as copolymerization monomers for preparing LCP.

[Chemical Formula 21]

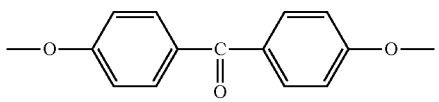
(3-3)

[Chemical Formula 22]

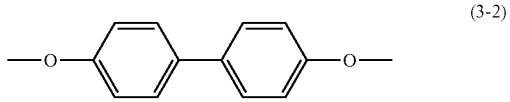

(3-2)

The second embodiment of the LCP according to the present invention can be obtained, for example, by copolymerizing p-hydroxybenzoic acid, an aromatic dicarboxylic acid, and an aromatic dihydroxy compound. A monomer ratio at this time is set so that the repeating structural unit represented by the above formula (1) in the LCP is 65 mole % to 78 mole % and the repeating structural unit represented by the above formula (3-1) in the LCP is 0.5 mole % to 17.5 mole %.

The content of the repeating structural unit represented by the above formula (1) is preferably 65 mole % to 78 mole % in terms of heat resistance and molding processability.

Examples of the aromatic dicarboxylic acid include terephthalic acid, isophthalic acid, 2,6-naphthalenedicarboxylic acid, and 4,4'-biphenyldicarboxylic acid. One of these can be used alone, or two or more of these can be used in combination.

In the second embodiment, it is preferable to copolymerize terephthalic acid so that 5 mole % to 17.5 mole % of terephthalic acid is contained in the LCP, in terms of heat resistance and molding processability.

Examples of the aromatic dihydroxy compound include 4,4'-dihydroxybenzophenone, bisphenol-S, bisphenol-A, hydroquinone, 4,4'-dihydroxybiphenyl(4,4'-biphenol), and 2,6-naphthalenediol. One of these can be used alone, or two or more of these can be used in combination.

In the second embodiment, it is preferable to copolymerize one or more of 4,4'-dihydroxybenzophenone, bisphenol-S, and bisphenol-A so that 0.5 mole % to 17.5 mole %, more preferably 0.5 mole % to 15 mole %, of one or more of 4,4'-dihydroxybenzophenone, bisphenol-S, and bisphenol-A are contained in total, for the purpose of introducing the repeating structural unit represented by the above formula (3-1).

In addition, in the second embodiment, it is preferable to use 4,4'-dihydroxybiphenyl and 4,4'-dihydroxybenzophenone in combination and copolymerize 4,4'-dihydroxybiphenyl and 4,4'-dihydroxybenzophenone so that 2.5 mole % to 17 mole % of 4,4'-dihydroxybiphenyl and 0.5 mole % to 15 mole % of 4,4'-dihydroxybenzophenone, more preferably 2.5 mole % to 14.5 mole % of 4,4'-dihydroxybiphenyl and 3 mole % to 15 mole % of 4,4'-dihydroxybenzophenone, are contained, in terms of heat resistance and molding processability.

Examples of a method for preparing the LCP according to the present invention include a method of charging p-hydroxybenzoic acid, the above aromatic dicarboxylic acid, and the above aromatic dihydroxy compound in a proportion in which a monomer composition in the LCP is 65 mole % to 78 mole %, 11 mole % to 17.5 mole %, and 11 mole % to 17.5 mole %, respectively, to perform melt polycondensation.

In the production of the LCP according to the present invention, in order to shorten melt polycondensation time and reduce the effect of a thermal history during steps, it is preferable to perform melt polycondensation after previously acetylating the hydroxyl groups of the above monomers. Further, in order to simplify the steps, it is preferable that the acetylation is performed by feeding acetic anhydride to the monomers in a reaction vessel, and it is preferable to perform this acetylation step using the same reaction vessel as in the melt polycondensation step. In other words, it is preferable to perform the acetylation reaction of the raw material monomers with acetic anhydride in a reaction vessel and, after the completion of the reaction, increase temperature to transition to a polycondensation reaction. In addition, it is preferable that acetic anhydride is fed so that the excessive amount of acetic anhydride is 1 to 10 mole % with respect to the number of moles of the hydroxyl groups of the monomers. If the excessive amount of acetic anhydride is less than 1 mole %, there is a tendency that a reaction rate is slow and the LCP is colored, and if the excessive amount of acetic anhydride is more than 10 mole %, there is a tendency that the LCP is colored by the effect of residual acetic anhydride.

The acetylated monomers can be subjected to a melt polycondensation reaction with an acetic acid removal reaction. As the reaction vessel, it is preferable to use a reaction vessel equipped with monomer feed means, acetic acid discharge means, molten polyester extraction means, and stirring means. Such a reaction vessel (polycondensation apparatus) can be appropriately selected from publicly known ones. Polymerization temperature is preferably 150° C. to 350° C. It is preferable to, after the completion of the acetylation reaction, increase temperature to polymerization initiation temperature to initiate polycondensation and increase the temperature in the range of 0.1° C./min to 2° C./min to 280 to 350° C. as final temperature. It is preferable to increase polycondensation temperature correspondingly to the fact that the melting temperature of a produced polymer increases with the progress of polycondensation, in this manner. In the polycondensation reaction, catalysts publicly known as polycondensation catalysts for polyesters can be used. Examples of the catalysts include metal catalysts, such as magnesium acetate, stannous acetate, tetrabutyl titanate, lead acetate, sodium acetate, and potassium acetate, and organic compound catalysts, such as N-methylimidazole.

In the melt polycondensation, when the flow point reaches 200° C. or more, preferably 220° C. to 330° C., a fully-aromatic thermotropic liquid crystal polyester having a low degree of polymerization is extracted from the polymerization vessel in a molten state, fed to a cooling machine, such as a steel belt or a drum cooler, and cooled and solidified.

Then, the solidified fully-aromatic thermotropic liquid crystal polyester having a low degree of polymerization is ground to a size suitable for the subsequent solid phase polycondensation reaction. A grinding method is not particularly limited, and preferable examples include methods using apparatuses such as impact type grinding machines, such as Feather Mill, Victory Mill, Kolloplex, Pulverizer, Contraplex, Scroll Mill, and ACM Pulverizer manufactured by Hosokawa Micron Corporation, and Roll Granulator, which is a cracking type grinding machine manufactured by MATSUBO Corporation. The grinding method is particularly preferably a method using Feather Mill manufactured by Hosokawa Micron Corporation. In the present invention, there is no particular limitation on the particle diameter of a ground product, and the particle diameter is preferably in the range of passing through 4 mesh to not passing through 2000 mesh with an industrial sieve (Tyler mesh), further preferably in the range of 5 mesh to 2000 mesh (0.01 to 4 mm), and most preferably in the range of 9 mesh to 1-450 mesh (0.02 to 2 mm).

Then, the ground product obtained in the grinding step is subjected to a solid phase polycondensation step to perform solid phase polycondensation. There is no particular limitation on an apparatus used for the solid phase polycondensation step, and its operation conditions, and publicly known apparatuses and methods can be used.

It is preferable that the LCP according to the present invention is obtained by two-stage polymerization of melt polycondensation and solid phase polycondensation, in that one in which coloration is little is obtained.

It is preferable that the LCP according to the present invention has a melting point of 300° C. or more and 380° C. or less, in terms of heat resistance and molding processability.

It is preferable that the content of the fully-aromatic thermotropic liquid crystal polyester in the fully-aromatic thermotropic liquid crystal polyester resin composition of the present invention is 30 to 80% by mass based on the total amount of the resin composition.

Titanium oxide used in the present invention means particles of $TiO_2$ and is one widely used as a white pigment. The titanium oxide particles are preferably rutile type titanium oxide particles, which are stable even at high temperature and have large light hiding power. In addition, the titanium oxide particles are preferably those in which primary (number average) particle diameter is 0.1 to 0.5 μM, more preferably 0.2 to 0.3 μm. When the primary number average particle diameter is in this range, light scattering efficiency is high, the light reflectance of the molded surface of a molded object increases, and one having high brightness is easily obtained. If the particle diameter is less than 0.1 μm, a result is that a light scattering effect is small, and the brightness of the molded surface decreases, and if the particle diameter is more than 0.5 μm, there is a tendency that the dispersibility of the titanium oxide particles in the resin (LCP) worsens, and a case where a filling amount is increased is not preferable in terms of workability. For the titanium oxide particles, commercial products, for example, SR-1 (trade name, manufactured by Sakai Chemical Industry Co., Ltd.), can be used.

The content of the titanium oxide particles in the resin composition is 50 to 150 parts by mass with respect to 100 parts by mass of the fully-aromatic thermotropic liquid crystal polyester, and is preferably 70 to 130 parts by mass. If the content of the titanium oxide particles is less than the above lower limit value, there is a tendency that a sufficient degree of whiteness is not obtained, and on the other hand, if the content of the titanium oxide particles is more than the above upper limit value, the heat resistance of a molded object obtained by injection-molding the resin composition is insufficient, and a possibility that blistering occurs when the molded object is heat treated increases, and therefore, there is a tendency that it is difficult to use the resin composition as reflector member applications, which require a good molded surface.

A white pigment other than titanium oxide particles can be blended in the fully-aromatic thermotropic liquid crystal polyester resin composition of the present invention in a range in which the effect of the invention of this application is not impaired. Examples of the white pigment include zinc oxide and lead carbonate.

It is preferable that the fully-aromatic thermotropic liquid crystal polyester resin composition of the present invention further contains a fibrous inorganic filler. Examples of the fibrous inorganic filler include glass fibers, alumina fibers, and wollastonite.

As the glass fibers, those used as general resin reinforcement materials, such as chopped strands and milled fibers, can be preferably used, and chopped strands are preferable. The fiber length of the glass fiber used is 100 μm to 10 mm, preferably 200 μm to 5 mm, and further preferably 0.1 mm to 3 mm, in terms of number average length. The thickness of the glass fiber is preferably a number average diameter of 5 to 20 μm in terms of flowability during injection molding, and is further preferably a number average diameter of 7 to 15 μm.

Preferable specific examples of the glass fibers include "PX-1" (number average fiber diameter: 10 μm, number average fiber length: 3 mm) manufactured by OWENS CORNING JAPAN LTD.

Further, an inorganic filler, for example, talc, mica, or silica, can be blended in the fully-aromatic thermotropic liquid crystal polyester resin composition of the present invention in a range in which the effect of the invention of this application is not impaired, to provide desired properties.

When the resin composition of the present invention comprises the fibrous inorganic filler, it is preferable that its content is 5 to 50 parts by mass with respect to 100 parts by mass of the fully-aromatic thermotropic liquid crystal polyester. If the content of the fibrous inorganic filler is less than the lower limit value, the effect of reinforcement is less likely to be obtained, and if the content of the fibrous inorganic filler is more than the upper limit value, there is a tendency that the productivity and molding processability of the resin composition decrease significantly.

One or two or more of various additives can be blended in the resin composition of the present invention in a range in which the object of the present invention is not impaired. Examples of the additives include usual additives, such as powdery or acicular inorganic fillers, such as silica, talc, and potassium titanate whiskers, antioxidants and heat stabilizers (for example, hindered phenols, hydroquinone, phosphites and substitution products thereof), ultraviolet-absorbing agents (for example, resorcinol, salicylate, benzotriazole, and benzophenone), lubricants and release agents (montanic acid and salts, esters, and half esters thereof, stearyl alcohol, stearamide, polyethylene wax, and the like), plasticizers, antistatic agents, and flame retardants, and other thermoplastic resins. These additives can be added to provide desired properties to the resin composition.

It is preferable that the fully-aromatic thermotropic liquid crystal polyester resin composition of the present invention has a complete melting temperature of 300° C. or more and 380° C. or less. Here, the complete melting temperature of the resin composition means change temperature from the crystalline phase to the liquid crystalline phase of the resin composition as described in Japanese Patent Application Laid-Open Publication No. 10-95839, and this change temperature can be obtained by an apparent viscosity-temperature curve. If the complete melting temperature is less than 300° C., the heat resistance of a molded object of the fully-aromatic thermotropic liquid crystal polyester resin composition may be insufficient, which is not preferable. On the other hand, if the complete melting temperature is more than 380° C., the molding processing temperature of the fully-aromatic thermotropic liquid crystal polyester resin composition is high, and therefore, a molded object surface may be discolored by excessive heat.

The fully-aromatic thermotropic liquid crystal polyester resin composition of the present invention described above can be subjected to molding processing at 380° C. or less and can form a molded object which sufficiently satisfies a degree of whiteness and heat resistance and in which discoloration due to light irradiation is less than that of conventional liquid crystal polyester resin compositions.

The fully-aromatic thermotropic liquid crystal polyester resin composition of the present invention can be preferably used as a resin composition for molding an LED reflector.

In the fully-aromatic thermotropic liquid crystal polyester resin composition of the present invention, light reflectance on the molded surface of a molded object obtained by injection molding, for light having a wavelength of 480 nm, is preferably 70% or more, more preferably 80% or more, and further preferably 85% or more. More specifically, the 480 nm wave light reflectance (relative reflectance when the diffuse reflectance of a standard white plate of barium sulfate is taken as 100%) of the surface of a 3 mm thick flat plate test piece obtained by injection molding under standard conditions using a standard mold is preferably 70% or more, more preferably 80% or more, and further preferably 85% or more. If such reflectance is less than the lower limit, there is a tendency that the molded object obtained from the resin composition cannot satisfy light reflection performance required as a reflector.

Further, it is preferable that in the fully-aromatic thermotropic liquid crystal polyester resin composition of the present invention, a decrease in light reflectance on the molded surface of a molded object obtained by injection molding, after 480 nm light irradiation, is small. Specifically, a difference between light reflectance before light irradiation and light reflectance before and after 500 hour light irradiation is preferably 15% or less, more preferably 10% or less. In addition, the above light reflectance before and after 500 hour light irradiation is preferably 70% or more.

The fully-aromatic thermotropic liquid crystal polyester resin composition of the present invention can be obtained by melting and kneading the above-described components (the fully-aromatic thermotropic liquid crystal polyester, the titanium oxide particles, and the fibrous inorganic filler as required). As an apparatus for melting and kneading, twin screw kneading machines can be used. More preferably, continuous extrusion type twin screw kneading machines having a pair of double thread screws can be used, and among them, a corotating type that allows the uniform dispersion of the filler by having a turning mechanism is preferable. When one which has a cylinder diameter of 40 mm φ or more with a large barrel-screw gap making the entry of the filler easy, in which a gap between screws is large and an intermeshing rate is 1.45 or more, and in which the filler can be fed from the middle of a cylinder is used, the resin composition of the present invention can efficiently be obtained. In addition, it is preferable to use one having equipment for feeding at least part of glass fibers to the middle of a cylinder.

It is preferable that the fully-aromatic thermotropic liquid crystal polyester and the titanium oxide particles are mixed using publicly known solid mixing equipment, for example, a ribbon blender, a tumbler blender, or a Henschel mixer, and the mixture is dried by a hot air dryer, a reduced pressure dryer, or the like as required, and fed from the hopper of a twin screw kneading machine.

In the production of a resin composition containing a fibrous inorganic filler, such as glass fibers, it is preferable to feed at least part of glass fibers to be blended, from the middle of the cylinder of a twin screw kneading machine (so-called side feed). Thus, there is a tendency that the mechanical strength of the welded portion of a molded object prepared by injection-molding the obtained resin composition improves more than in a case where all glass fibers are fed from a hopper together with other raw materials (so-called top feed). The proportion of the glass fibers for side feed, of the total amount of the glass fibers to be blended, is preferably 50% or more, most preferably 100%. If the proportion of the glass fibers for side feed is less than the above lower limit, there is a tendency that compounding (blending and mixing) is difficult and a homogeneous resin composition cannot be obtained.

The molded object of the present invention is prepared by molding the fully-aromatic thermotropic liquid crystal polyester resin composition of the present invention described above. Examples of a molding method include injection molding, extrusion molding, and press molding, and injection molding using an injection molding machine is preferable in terms of the ease of molding, mass productivity, cost, and the like. For example, by injection-molding the fully-aromatic thermotropic liquid crystal polyester resin composition of the present invention that is pelletized and using the surface of the injection-molded article as a reflective surface, an LED reflector that is excellent in light reflectance and heat resistance and is less likely to be discolored by light can be obtained. Particularly, the resin composition of the present invention is less likely to be discolored than conventional liquid crystal polyester resin compositions even if it receives light in ultraviolet light to visible light regions, and therefore, an LED reflector also suitable for a high power LED can be obtained.

In the LED reflector of the present invention, light reflectance on a surface for light having a wavelength of 480 nm is preferably 70% or more, more preferably 80% or more, and further preferably 85% or more.

EXAMPLES

The present invention will be more specifically described below by Examples, but the present invention is not limited to the following Examples.

First Examples and Comparative Examples

Production of Fully-Aromatic Thermotropic Liquid Crystal Polyesters

First, examples of the production of fully-aromatic thermotropic liquid crystal polyesters are shown below. In addition, the monomer composition (mole %) and melting point of the produced polyesters are shown in Table 1.

Production Example 1

Production of Fully-Aromatic Thermotropic Liquid Crystal Polyester (A)

207.2 kg (1.5 kilomoles) of p-hydroxybenzoic acid (manufactured by UENO FINE CHEMICALS INDUSTRY, LTD.), 31.1 kg (0.19 kilomoles) of terephthalic acid (manufactured by Mitsui Chemicals, Inc.), 17.3 kg (0.1 kilomoles) of isophthalic acid (manufactured by A.G. International Chemical Company Inc.), 54.3 kg (0.29 kilomoles) of 4,4'-dihydroxybiphenyl (manufactured by Honshu Chemical Industry Co., Ltd.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

After the completion of acetylation, the temperature of the polymerization vessel in an acetic acid distillation state was increased at 0.5° C./min, and when reactor temperature reached 310° C., a polymer was removed from an extraction port in the lower portion of the reactor, and cooled and solidified by a cooling apparatus. The obtained polymer was ground to a size passing through a sieve having an opening of 2.0 mm by a grinding machine manufactured by Hosokawa Micron Corporation to obtain a prepolymer.

Next, the prepolymer obtained above was charged into a rotary kiln manufactured by Takasago Industry Co., Ltd., nitrogen was flowed at a flow rate of 16 Nm$^3$/hr, and at a rotation rate of 2 rpm, heater temperature was increased from room temperature to 170° C. over 3 hours, then increased to 260° C. over 5 hours, and further increased to 290° C. over 3 hours to perform solid phase polycondensation. In this manner, about 400 kg of a powdery fully-aromatic thermotropic liquid crystal polyester (A) was obtained. The melting point of the obtained fully-aromatic thermotropic liquid crystal polyester (A) was 355° C.

Production Example 2

Production of Fully-Aromatic Thermotropic Liquid Crystal Polyester (B)

207.2 kg (1.5 kilomoles) of p-hydroxybenzoic acid (manufactured by UENO FINE CHEMICALS INDUSTRY, LTD.), 34.6 kg (0.21 kilomoles) of terephthalic acid (manufactured by Mitsui Chemicals, Inc.), 18.0 kg (0.08 kilomoles) of 2,6-naphthalenedicarboxylic acid (manufactured by TOKYO CHEMICAL INDUSTRY CO., LTD.), 54.3 kg (0.29 kilomoles) of 4,4'-dihydroxybiphenyl (manufactured by Honshu Chemical Industry Co., Ltd.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (B). The melting point of the obtained fully-aromatic thermotropic liquid crystal polyester (B) was 345° C.

Production Example 3

Production of Fully-Aromatic Thermotropic Liquid Crystal Polyester (C)

207.2 kg (1.5 kilomoles) of p-hydroxybenzoic acid (manufactured by UENO FINE CHEMICALS INDUSTRY, LTD.), 34.6 kg (0.21 kilomoles) of terephthalic acid (manufactured by Mitsui Chemicals, Inc.), 20.2 kg (0.08 kilomoles) of 4,4'-biphenyldicarboxylic acid (manufactured by TOKYO CHEMICAL INDUSTRY CO., LTD.), 54.3 kg (0.29 kilomoles) of 4,4'-dihydroxybiphenyl (manufactured by Honshu Chemical Industry Co., Ltd.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (C). The melting point of the obtained fully-aromatic thermotropic liquid crystal polyester (C) was 345° C.

Production Example 4

Production of Fully-Aromatic Thermotropic Liquid Crystal Polyester (D)

207.2 kg (1.5 kilomoles) of p-hydroxybenzoic acid (manufactured by UENO FINE CHEMICALS INDUSTRY, LTD.), 34.6 kg (0.21 kilomoles) of terephthalic acid (manufactured by Mitsui Chemicals, Inc.), 13.8 kg (0.08 kilomoles) of isophthalic acid (manufactured by A.G. International Chemical Company Inc.), 46.6 kg (0.25 kilomoles) of 4,4'-dihydroxybiphenyl (manufactured by Honshu Chemical Industry Co., Ltd.), 4.6 kg (0.04 kilomoles) of hydroquinone (manufactured by TOKYO CHEMICAL INDUSTRY CO., LTD.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (D). The melting point of the obtained fully-aromatic thermotropic liquid crystal polyester (D) was 357° C.

Production Example 5

Production of Fully-Aromatic Thermotropic Liquid Crystal Polyester (E)

207.2 kg (1.5 kilomoles) of p-hydroxybenzoic acid (manufactured by UENO FINE CHEMICALS INDUSTRY, LTD.), 34.6 kg (0.21 kilomoles) of terephthalic acid (manufactured by Mitsui Chemicals, Inc.), 13.8 kg (0.08 kilomoles) of isophthalic acid (manufactured by A.C. International Chemical Company Inc.), 46.6 kg (0.25 kilomoles) of 4,4'-dihydroxybiphenyl (manufactured by Honshu Chemical Industry Co., Ltd.), 6.7 kg (0.04 kilomoles) of 2,6-naphthalenediol (manufactured by TOKYO CHEMICAL INDUSTRY CO., LTD.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (E). The melting point of the obtained fully-aromatic thermotropic liquid crystal polyester (E) was 353° C.

Production Example 6

Production of Fully-Aromatic Thermotropic Liquid Crystal Polyester (F)

193.4 kg (1.4 kilomoles) of p-hydroxybenzoic acid (manufactured by UENO FINE CHEMICALS INDUSTRY, LTD.), 42.3 kg (0.25 kilomoles) of terephthalic acid (manufactured by Mitsui Chemicals, Inc.), 17.6 kg (0.11 kilomoles) of isophthalic acid (manufactured by A.G. International Chemical Company Inc.), 67.1 kg (0.36 kilomoles) of 4,4'-dihydroxybiphenyl (manufactured by Honshu Chemical Industry Co., Ltd.), 0.05 kg of potassium acetate (manufactured by KISHIDA CHEMICAL Co., Ltd.) as a catalyst, and 0.14 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 220.2 kg (2.16 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (F). The melting point of the obtained fully-aromatic thermotropic liquid crystal polyester (F) was 353° C.

Production Example 7

Production of Fully-Aromatic Thermotropic Liquid Crystal Polyester (G)

227.9 kg (1.65 kilomoles) of p-hydroxybenzoic acid (manufactured by UENO FINE CHEMICALS INDUSTRY, LTD.), 21.4 kg (0.13 kilomoles) of terephthalic acid (manufactured by Mitsui Chemicals, Inc.), 17.6 kg (0.11 kilomoles) of isophthalic acid (manufactured by A.G. International Chemical Company Inc.), 43.9 kg (0.24 kilomoles) of 4,4'-dihydroxybiphenyl (manufactured by Honshu Chemical Industry Co., Ltd.), 0.06 kg of potassium acetate (manufactured by KISHIDA CHEMICAL Co., Ltd.) as a catalyst, and 0.17 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 219.0 kg (2.15 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (G). The melting point of the obtained fully-aromatic thermotropic liquid crystal polyester (G) was 357° C.

Production Example 8

Production of Fully-Aromatic Thermotropic Liquid Crystal Polyester (H)

172.7 kg (1.25 kilomoles) of p-hydroxybenzoic acid (manufactured by UENO FINE CHEMICALS INDUSTRY, LTD.), 51.9 kg (0.31 kilomoles) of terephthalic acid (manufactured by Mitsui Chemicals, Inc.), 16.6 kg (0.10 kilomoles) of isophthalic acid (manufactured by A.G. International Chemical Company Inc.), 77.6 kg (0.42 kilomoles) of 4,4'-dihydroxybiphenyl (manufactured by Honshu Chemical Industry Co., Ltd.), 0.04 kg of potassium acetate (manufactured by KISHIDA CHEMICAL Co., Ltd.) as a catalyst, and 0.13 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 216.9 kg (2.13 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (H). The melting point of the obtained fully-aromatic thermotropic liquid crystal polyester (H) was 355° C.

Production Example 9

Production of Fully-Aromatic Thermotropic Liquid Crystal Polyester (I)

138.1 kg (1.0 kilomole) of p-hydroxybenzoic acid (manufactured by UENO FINE CHEMICALS INDUSTRY, LTD.), 56.5 kg (0.34 kilomoles) of terephthalic acid (manufactured by Mitsui Chemicals, Inc.), 26.6 kg (0.16 kilomoles) of isophthalic acid (manufactured by A.G. International Chemical Company Inc.), 93.1 kg (0.50 kilomoles) of 4,4'-dihydroxybiphenyl (manufactured by Honshu Chemical Industry Co., Ltd.), 0.04 kg of potassium acetate (manufactured by KISHIDA CHEMICAL Co., Ltd.) as a catalyst, and 0.10 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 209.3 kg (2.05 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (I). The melting point of the obtained fully-aromatic thermotropic liquid crystal polyester (I) was 355° C.

Production Example 10

Production of Fully-Aromatic Thermotropic Liquid Crystal Polyester (J)

234.8 kg (1.7 kilomoles) of p-hydroxybenzoic acid (manufactured by UENO FINE CHEMICALS INDUSTRY, LTD.), 17.7 kg (0.11 kilomoles) of terephthalic acid (manufactured by Mitsui Chemicals, Inc.), 17.7 kg (0.11 kilomoles) of isophthalic acid (manufactured by A.G. International Chemical Company Inc.), 39.6 kg (0.21 kilomoles) of 4,4'-dihydroxybiphenyl (manufactured by Honshu Chemical Industry Co., Ltd.), 0.06 kg of potassium acetate (manufactured by KISHIDA CHEMICAL Co., Ltd.) as a catalyst, and 0.18 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 219.1 kg (2.15 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 1, a prepolymer was obtained, and then, solid phase polycondensation was performed to obtain about 400 kg of a powdery fully-aromatic thermotropic liquid crystal polyester (J). In the obtained fully-aromatic thermotropic liquid crystal polyester (J), no melting point was observed, and the obtained fully-aromatic thermotropic liquid crystal polyester (J) pyrolyzed without melting even when temperature was increased.

(Measurement of Melting Point)

The melting point of the fully-aromatic thermotropic liquid crystal polyester was measured by a differential scanning calorimeter (DSC) manufactured by Seiko Instruments & Electronics Ltd., using α-alumina as a reference. At this time, the top of an endothermic peak obtained when temperature was increased from room temperature to 400° C. at a temperature increase rate of 20° C./min to completely fuse the polymer, then decreased to 150° C. at a rate of 10° C./min, and further increased to 420° C. at a rate of 20° C./min was taken as the melting point.

<Titanium Oxide Particles>

A trade name "SR-1" (primary particle diameter: 0.25 μm) manufactured by Sakai Chemical Industry Co., Ltd. was prepared.

<Glass Fibers>

"PX-1" (average fiber length: 3 mm, average diameter: 10 μm) manufactured by OWENS CORNING was prepared.

Production of Resin Compositions

Example 1

100 Parts by mass of titanium oxide particles (SR-1, manufactured by Sakai Chemical Industry Co., Ltd.) were previously mixed with 100 parts by mass of the fully-aromatic thermotropic liquid crystal polyester (A) obtained above, and the mixture was dried in an air oven at 150° C. for 2 hours. This dried mixture was fed to the hopper of a twin screw extruder (KTX-46, manufactured by Kobe Steel, Ltd.) set at the highest temperature of a cylinder, 370° C., 22 parts by mass of glass fibers (PX-1, manufactured by OWENS CORNING) were further fed (side-fed) to the middle of the cylinder of the twin screw extruder, and the mixture was melted and kneaded at an extrusion rate of 160 kg/hr to obtain pellets of a fully-aromatic thermotropic liquid crystal polyester resin composition.

Examples 2 to 7

Pellets of fully-aromatic thermotropic liquid crystal polyester resin compositions were respectively ob-

TABLE 1

| | Monomer composition (mole %) | | | | | | | | Melting point (° C.) |
| --- | --- | --- | --- | --- | --- | --- | --- | --- | --- |
| | (1) HBA | (2)-1 TPA | (2)-2 IPA | (2)-3 NADC | (2)-4 BPDC | (3)-1 BP | (3)-2 HQ | (3)-3 NADO | |
| Polyester A | 72 | 9 | 5 | | | 14 | | | 355 |
| Polyester B | 72 | 10 | | 4 | | 14 | | | 345 |
| Polyester C | 72 | 10 | | | 4 | 14 | | | 345 |
| Polyester D | 72 | 10 | 4 | | | 12 | 2 | | 357 |
| Polyester E | 72 | 10 | 4 | | | 12 | | 2 | 353 |
| Polyester F | 66 | 12 | 5 | | | 17 | | | 353 |
| Polyester G | 77 | 6 | 5 | | | 11 | | | 357 |
| Polyester H | 60 | 15 | 5 | | | 20 | | | 355 |
| Polyester I | 50 | 17 | 8 | | | 25 | | | 355 |
| Polyester J | 80 | 5 | 5 | | | 10 | | | — |

In Table 1, HBA represents p-hydroxybenzoic acid, TPA represents terephthalic acid, IPA represents isophthalic acid, NADC represents 2,6-naphthalenedicarboxylic acid, BPDC represents 4,4'-biphenyldicarboxylic acid, BP represents 4,4'-dihydroxybiphenyl, HQ represents hydroquinone, and NADO represents 2,6-naphthalenediol.

The melting point of the fully-aromatic thermotropic liquid crystal polyesters was measured by the following method.

tained by the same equipment and operation method as in Example 1 except that the fully-aromatic thermotropic liquid crystal polyesters (B) to (G) were used instead of the fully-aromatic thermotropic liquid crystal polyester (A), and the components were mixed so as to provide compositions shown in Table 2 (the compositions in the table indicate parts by mass).

Comparative Examples 1 and 2

Pellets of fully-aromatic thermotropic liquid crystal polyester resin compositions were respectively obtained by the same equipment and operation method as in Example 1 except that the fully-aromatic thermotropic liquid crystal polyesters (H) and (I) were used instead of the fully-aromatic thermotropic liquid crystal polyester (A), and the components were mixed so as to provide compositions shown in Table 2 (the compositions in the table indicate parts by mass).

Comparative Example 3

An attempt was made to produce pellets of a fully-aromatic thermotropic liquid crystal polyester resin composition by the same equipment and operation method as in Example 1 except that the fully-aromatic thermotropic liquid crystal polyester (J) was used instead of the fully-aromatic thermotropic liquid crystal polyester (A) and the components were mixed so as to provide a composition shown in Table 2 (the compositions in the table indicate parts by mass), but the fully-aromatic thermotropic liquid crystal polyester (J) did not melt, and therefore, pellets could not be obtained.

<Fabrication of Test Pieces by Injection Molding Method>

The pellets of the resin compositions obtained in the above Examples and Comparative Examples were injection-molded at a cylinder highest temperature of 350° C., an injection rate of 100 mm/sec, and a mold temperature of 80° C., using an injection molding machine (SG-25 manufactured by Sumitomo Heavy Industries, Ltd.), to fabricate mm (width)×130 mm (length)×3.0 mm (thickness) injection-molded objects. These were used as test pieces for the measurement of light reflectance. In addition, injection molding was performed under the same conditions as the above to fabricate flexural test pieces according to ASTM D790, and the flexural test pieces were used as test pieces for the measurement of distortion temperature under load (DTUL) and flexural modulus.

For the test pieces obtained above, initial light reflectance, light reflectance after a light irradiation test, distortion temperature under load, and flexural modulus were measured by the following methods. Results are shown in Table 2. For Comparative Example 3 in which pellets were not obtained, evaluation tests were not performed. In addition, the complete melting temperature of the pellets of the resin compositions measured by the following method is also shown together in Table 2.

(Measurement of Initial Light Reflectance)

For the surfaces of the obtained test pieces for light reflectance measurement, the measurement of diffuse reflectance for light having a wavelength of 480 nm was performed using a self-recording spectrophotometer (U-3500: manufactured by Hitachi, Ltd.). Light reflectance is a relative value when the diffuse reflectance of a barium sulfate standard white plate is taken as 100%.

(Measurement of Light Reflectance after Light Irradiation Test)

A light irradiation test in which using SUNIEST XLS+ manufactured by Toyo Seiki Seisaku-sho, Ltd., 500 hour light irradiation was performed by a xenon lamp with the setting of 600 W/m$^2$ and a BPT temperature of 90° C. was performed on the obtained test pieces for light reflectance measurement. For the surfaces of the test pieces after this light irradiation test, the measurement of diffuse reflectance for light having a wavelength of 480 nm was performed using a self-recording spectrophotometer (U-3500: manufactured by Hitachi, Ltd.). Light reflectance is a relative value when the diffuse reflectance of a barium sulfate standard white plate is taken as 100%.

(Measurement of Distortion Temperature Under Load)

Using the test pieces for flexural tests fabricated above, the measurement of distortion temperature under load (DTUL) was performed according to ASTM D648.

(Measurement of Flexural Modulus)

Using the test pieces for flexural tests fabricated above, the measurement of flexural modulus was performed according to ASTM D790.

(Measurement of Complete Melting Temperature)

By a capillary rheometer (model 2010) manufactured by INTESCO co., Ltd. and using one having a capillary diameter of 1.0 mm, a length of 40 mm, and an inflow angle of 90°, the measurement of apparent viscosity was performed at a shear rate of 100 sec$^{-1}$ while constant rate heating was performed at a temperature increase rate of +4° C./min from the melting point −30° C. to the melting point+20° C., and an apparent viscosity-temperature curve was obtained. Temperature corresponding to the intersection point of an approximate straight line in a region in which a change in apparent viscosity with respect to temperature was sudden and an approximate straight line in a region in which a change in apparent viscosity with respect to temperature was gradual in the obtained curve was obtained, and this was taken as complete melting temperature.

TABLE 2

|  | Fully-aromatic thermotropic liquid crystal polyester (parts by mass) | Titanium oxide particles (parts by mass) | Glass fibers (parts by mass) | Initial light reflectance %, 480 nm | Light reflectance after light irradiation test %, 480 nm | Distortion temperature under load DTUL (° C.) | Flexural modulus (GPa) | Complete melting temperature (° C.) |
|---|---|---|---|---|---|---|---|---|
| Example 1 | A | 100 | 100 | 22 | 86 | 78 | 270 | 15.5 | 360 |
| Example 2 | B | 100 | 100 | 22 | 87 | 78 | 265 | 15.5 | 350 |
| Example 3 | C | 100 | 100 | 22 | 87 | 78 | 268 | 15.7 | 350 |
| Example 4 | D | 100 | 100 | 22 | 85 | 75 | 265 | 15.7 | 365 |
| Example 5 | E | 100 | 100 | 22 | 86 | 76 | 264 | 15.6 | 358 |
| Example 6 | F | 100 | 100 | 22 | 84 | 73 | 261 | 13.8 | 360 |
| Example 7 | G | 100 | 100 | 22 | 85 | 78 | 270 | 16.0 | 363 |
| Comparative Example 1 | H | 100 | 100 | 22 | 86 | 69 | 266 | 12.5 | 360 |
| Comparative Example 2 | I | 100 | 100 | 22 | 84 | 65 | 267 | 13.7 | 360 |
| Comparative Example 3 | J | — | — | — | — | — | — | — | — |

It was found that all of the resin compositions of Examples 1 to 7 obtained by using the fully-aromatic thermotropic liquid crystal polyesters A to G in which the content of p-hydroxybenzoic acid (HBA) was in the range of 65 to 78 mole % were capable of being injection-molded at 380° C. or less, and as shown in Table 2, all of the initial light reflectance of the molded articles for 480 nm light was as high as 80% or more, and the light reflectance after the 500 hour light irradiation test decreased only by about 10% with respect to the initial light reflectance and maintained a high level of 73 to 78%. In addition, no discoloration of the molded object surfaces was seen. Further, it was confirmed that all of the injection-molded objects obtained from the resin compositions of Examples 1 to 7 had a distortion temperature under load (DTUL) of more than 260° C. and a flexural modulus as high as 13 GPa or more, having a high degree of heat resistance and mechanical properties.

On the other hand, in the resin compositions of Comparative Examples 1 and 2 obtained by using the fully-aromatic thermotropic liquid crystal polyesters H and I in which the content of HBA was 60 mole % and 50 mole %, less than the range of the present invention, the initial light reflectance was 80% or more, but the light reflectance after 500 hour light irradiation decreased by as much as 17% and 19%, respectively, from the initial light reflectance and was less than 70%. In addition, the fully-aromatic thermotropic liquid crystal polyester J in which the content of HBA was 80 mole %, more than the upper limit of the range of the present invention, did not melt even when it was heated, and a resin composition could not be produced.

Second Examples and Comparative Examples

Production of Fully-Aromatic Thermotropic Liquid Crystal Polyesters

First, examples of the production of fully-aromatic thermotropic liquid crystal polyesters are shown below. In addition, the monomer composition (mole %) and melting point of the produced polyesters are shown in Table 3.

Production Example 11

Production of Fully-Aromatic Thermotropic Liquid Crystal Polyester (A-2)

207.2 kg (1.5 kilomoles) of p-hydroxybenzoic acid (manufactured by UENO FINE CHEMICALS INDUSTRY, LTD.), 36.7 kg (0.23 kilomoles) of 4,4'-dihydroxybiphenyl (manufactured by Honshu Chemical Industry Co., Ltd.), 34.6 kg (0.21 kilomoles) of terephthalic acid (manufactured by Mitsui Chemicals, Inc.), 13.8 kg (0.08 kilomoles) of isophthalic acid (manufactured by A.G. International Chemical Company Inc.), 13.4 kg (0.06 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

After the completion of acetylation, the temperature of the polymerization vessel in an acetic acid distillation state was increased at 0.5° C./min, and when reactor temperature reached 310° C., a polymer was removed from an extraction port in the lower portion of the reactor, and cooled and solidified by a cooling apparatus. The obtained polymer was ground to a size passing through a sieve having an opening of 2.0 mm by a grinding machine manufactured by Hosokawa Micron Corporation to obtain a prepolymer.

Next, the prepolymer obtained above was charged into a rotary kiln manufactured by Takasago Industry Co., Ltd., nitrogen was flowed at a flow rate of 16 Nm³/hr, and at a rotation rate of 2 rpm, heater temperature was increased from room temperature to 170° C. over 3 hours, then increased to 260° C. over 5 hours, and further increased to 290° C. over 3 hours to perform solid phase polycondensation. In this manner, about 400 kg of a powdery fully-aromatic thermotropic liquid crystal polyester (A-2) was obtained. The melting point of the obtained fully-aromatic thermotropic liquid crystal polyester (A-2) was 335° C.

Production Example 12

Production of Fully-Aromatic Thermotropic Liquid Crystal Polyester (B-2)

221.0 kg (1.6 kilomoles) of p-hydroxybenzoic acid (manufactured by UENO FINE CHEMICALS INDUSTRY, LTD.), 27.7 kg (0.17 kilomoles) of 4,4'-dihydroxybiphenyl (manufactured by Honshu Chemical Industry Co., Ltd.), 32.3 kg (0.19 kilomoles) of terephthalic acid (manufactured by Mitsui Chemicals, Inc.), 14.4 kg (0.09 kilomoles) of isophthalic acid (manufactured by A.G. International Chemical Company Inc.), 23.2 kg (0.11 kilomoles) of 4,4'-dihydroxybenzophenone (manufactured by Benzo Chem Industries Pvt. Limited), 0.06 kg of potassium acetate (manufactured by KISHIDA CHEMICAL Co., Ltd.) as a catalyst, and 0.16 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 223.6 kg (2.19 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (B-2). The melting point of the obtained fully-aromatic thermotropic liquid crystal polyester (B-2) was 330° C.

Production Example 13

Production of Fully-Aromatic Thermotropic Liquid Crystal Polyester (C-2)

221.0 kg (1.6 kilomoles) of p-hydroxybenzoic acid (manufactured by UENO FINE CHEMICALS INDUSTRY, LTD.), 43.3 kg (0.27 kilomoles) of 4,4'-dihydroxybiphenyl (manufactured by Honshu Chemical Industry Co., Ltd.), 32.3 kg (0.19 kilomoles) of terephthalic acid (manufactured by Mitsui Chemicals, Inc.), 14.4 kg (0.09 kilomoles) of isophthalic acid (manufactured by A.G. International Chemical Company Inc.), 2.3 kg (0.01 kilomoles) of 4,4'-dihydroxybenzophenone (manufactured by Benzo Chem Industries Pvt. Limited), 0.06 kg of potassium acetate (manufactured by KISHIDA CHEMICAL Co., Ltd.) as a catalyst, and 0.16 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 223.6 kg (2.19 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (C-2). The melting point of the obtained fully-aromatic thermotropic liquid crystal polyester (C-2) was 358° C.

Production Example 14

Production of Fully-Aromatic Thermotropic Liquid Crystal Polyester (D-2)

221.0 kg (1.6 kilomoles) of p-hydroxybenzoic acid (manufactured by UENO FINE CHEMICALS INDUSTRY, LTD.), 15.4 kg (0.10 kilomoles) of 4,4'-dihydroxybiphenyl (manufactured by Honshu Chemical Industry Co., Ltd.), 33.7 kg (0.20 kilomoles) of terephthalic acid (manufactured by Mitsui Chemicals, Inc.), 10.6 kg (0.06 kilomoles) of isophthalic acid (manufactured by A.G. International Chemical Company Inc.), 36.6 kg (0.17 kilomoles) of 4,4'-dihydroxybenzophenone (manufactured by Benzo Chem Industries Pvt. Limited), 0.06 kg of potassium acetate (manufactured by KISHIDA CHEMICAL Co., Ltd.) as a catalyst, and 0.16 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 220.5 kg (2.16 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (D-2). The melting point of the obtained fully-aromatic thermotropic liquid crystal polyester (D-2) was 320° C.

Production Example 15

Production of Fully-Aromatic Thermotropic Liquid Crystal Polyester (E-2)

193.4 kg (1.4 kilomoles) of p-hydroxybenzoic acid (manufactured by UENO FINE CHEMICALS INDUSTRY, LTD.), 37.4 kg (0.23 kilomoles) of 4,4'-dihydroxybiphenyl (manufactured by Honshu Chemical Industry Co., Ltd.), 56.4 kg (0.34 kilomoles) of terephthalic acid (manufactured by Mitsui Chemicals, Inc.), 7.0 kg (0.04 kilomoles) of isophthalic acid (manufactured by A.G. International Chemical Company Inc.), 27.3 kg (0.13 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.14 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 220.2 kg (2.16 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (E-2). The melting point of the obtained fully-aromatic thermotropic liquid crystal polyester (E-2) was 325° C.

Production Example 16

Production of Fully-Aromatic Thermotropic Liquid Crystal Polyester (F-2)

207.2 kg (1.5 kilomoles) of p-hydroxybenzoic acid (manufactured by UENO FINE CHEMICALS INDUSTRY, LTD.), 36.7 kg (0.23 kilomoles) of 4,4'-dihydroxybiphenyl (manufactured by Honshu Chemical Industry Co., Ltd.), 34.6 kg (0.21 kilomoles) of terephthalic acid (manufactured by Mitsui Chemicals, Inc.), 18.0 kg (0.08 kilomoles) of 2,6-naphthalenedicarboxylic acid (manufactured by TOKYO CHEMICAL INDUSTRY CO., LTD.), 13.4 kg (0.06 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (F-2). The melting point of the obtained fully-aromatic thermotropic liquid crystal polyester (F-2) was 330° C.

Production Example 17

Production of Fully-Aromatic Thermotropic Liquid Crystal Polyester (G-2)

207.2 kg (1.5 kilomoles) of p-hydroxybenzoic acid (manufactured by UENO FINE CHEMICALS INDUSTRY, LTD.), 36.7 kg (0.23 kilomoles) of 4,4'-dihydroxybiphenyl (manufactured by Honshu Chemical Industry Co., Ltd.), 34.6 kg (0.21 kilomoles) of terephthalic acid (manufactured by Mitsui Chemicals, Inc.), 20.2 kg (0.08 kilomoles) of 4,4'-biphenyldicarboxylic acid (manufactured by TOKYO CHEMICAL INDUSTRY CO., LTD.), 13.4 kg (0.06 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (G-2). The melting point of the obtained fully-aromatic thermotropic liquid crystal polyester (G-2) was 332° C.

Production Example 18

Production of Fully-Aromatic Thermotropic Liquid Crystal Polyester (H-2)

207.2 kg (1.5 kilomoles) of p-hydroxybenzoic acid (manufactured by UENO FINE CHEMICALS INDUSTRY, LTD.), 36.7 kg (0.23 kilomoles) of 4,4'-dihydroxybiphenyl (manufactured by Honshu Chemical Industry Co., Ltd.), 34.6 kg (0.21 kilomoles) of terephthalic acid (manufactured by Mitsui Chemicals, Inc.), 13.8 kg (0.08 kilomoles) of isophthalic acid (manufactured by A.G. International Chemical Company Inc.), 15.6 kg (0.06 kilomoles) of bisphenol-S (manufactured by TOKYO CHEMICAL INDUSTRY CO., LID.), 0.05 kg of potassium acetate (manufactured by KISHIDA CHEMICAL Co., Ltd.) as a catalyst, and 0.15 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 215.7 kg (2.11 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (H-2). The melting point of the obtained fully-aromatic thermotropic liquid crystal polyester (H-2) was 350° C.

Production Example 19

Production of Fully-Aromatic Thermotropic Liquid Crystal Polyester (1-2)

221.0 kg (1.6 kilomoles) of p-hydroxybenzoic acid (manufactured by UENO FINE CHEMICALS INDUSTRY, LTD.), 43.3 kg (0.27 kilomoles) of 4,4'-dihydroxybiphenyl (manufactured by Honshu Chemical Industry Co., Ltd.), 32.3 kg (0.19 kilomoles) of terephthalic acid (manufactured by Mitsui Chemicals, Inc.), 14.4 kg (0.09 kilomoles) of isophthalic acid (manufactured by A.G. International Chemical Company Inc.), 2.5 kg (0.01 kilomoles) of bisphenol-A (manufactured by TOKYO CHEMICAL INDUSTRY CO., LIU), 0.06 kg of potassium acetate (manufactured by KISHIDA CHEMICAL Co., Ltd.) as a catalyst, and 0.16 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 223.6 kg (2.19 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (I-2). The melting point of the obtained fully-aromatic thermotropic liquid crystal polyester (I-2) was 358° C.

Production Example 20

Production of Fully-Aromatic Thermotropic Liquid Crystal Polyester (J-2)

193.4 kg (1.4 kilomoles) of p-hydroxybenzoic acid (manufactured by UENO FINE CHEMICALS INDUSTRY, LTD.), 49.8 kg (0.30 kilomoles) of terephthalic acid (manufactured by Mitsui Chemicals, Inc.), 64.3 kg (0.30 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.14 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 207.2 kg (2.03 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (J-2). The melting point of the obtained fully-aromatic thermotropic liquid crystal polyester (J-2) was 360° C.

Production Example 21

Production of Fully-Aromatic Thermotropic Liquid Crystal Polyester (K-2)

179.6 kg (1.30 kilomoles) of p-hydroxybenzoic acid (manufactured by UENO FINE CHEMICALS INDUSTRY, LTD.), 54.0 kg (0.33 kilomoles) of terephthalic acid (manufactured by Mitsui Chemicals, Inc.), 69.4 kg (0.43 kilomoles) of 4,4'-dihydroxybiphenyl (manufactured by Honshu Chemical Industry Co., Ltd.), 18.0 kg (0.11 kilomoles) of isophthalic acid (manufactured by A.G. International Chemical Company Inc.), 0.05 kg of potassium acetate (manufactured by KISHIDA CHEMICAL Co., Ltd.) as a catalyst, and 0.13 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 225.6 kg (2.21 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (K-2). The melting point of the obtained fully-aromatic thermotropic liquid crystal polyester (K-2) was 355° C.

Production Example 22

Production of Fully-Aromatic Thermotropic Liquid Crystal Polyester (L-2)

179.6 kg (1.30 kilomoles) of p-hydroxybenzoic acid (manufactured by UENO FINE CHEMICALS INDUSTRY, LTD.), 54.0 kg (0.33 kilomoles) of terephthalic acid (manufactured by Mitsui Chemicals, Inc.), 18.0 kg (0.11 kilomoles) of isophthalic acid (manufactured by A.G. International Chemical Company Inc.), 92.8 kg (0.43 kilomoles) of 4,4'-dihydroxybenzophenone (manufactured by Benzo Chem Industries Pvt. Limited), 0.05 kg of potassium acetate (manufactured by KISHIDA CHEMICAL Co., Ltd.) as a catalyst, and 0.13 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 225.6 kg (2.21 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (L-2). The melting point of the obtained fully-aromatic thermotropic liquid crystal polyester (L-2) was 320° C.

Production Example 23

Production of Fully-Aromatic Thermotropic Liquid Crystal Polyester (M-2)

234.8 kg (1.70 kilomoles) of p-hydroxybenzoic acid (manufactured by UENO FINE CHEMICALS INDUSTRY, LTD.), 17.7 kg (0.11 kilomoles) of terephthalic acid (manufactured by Mitsui Chemicals, Inc.), 17.7 kg (0.11 kilomoles) of isophthalic acid (manufactured by A.G. International Chemical Company Inc.), 22.8 kg (0.11 kilomoles) of 4,4'-dihydroxybenzophenone (manufactured by Benzo Chem Industries Pvt. Limited), 17.0 kg (0.11 kilomoles) of 4,4'-dihydroxybiphenyl (manufactured by Honshu Chemical Industry Co., Ltd.), 0.06 kg of potassium acetate (manufactured by KISHIDA CHEMICAL Co., Ltd.) as a catalyst, and 0.18 kg of magnesium acetate (manufactured by KISHIDA CHEMICAL Co., Ltd.) were charged into a polymerization vessel using SUS316 as a material, having a double helical stirring blade, and having an internal volume of 1700 L (manufactured by Kobe Steel, Ltd.), pressure reduction-nitrogen injection in the polymerization vessel was performed twice to perform nitrogen replacement, then 219.1 kg (2.15 kilomoles) of acetic anhydride was further added, the rotation rate of the stirring blade was set to 45 rpm, temperature was increased to 150° C. over 1.5 hours, and an acetylation reaction was performed in a reflux state for 2 hours.

Next, as in Production Example 11, a prepolymer was obtained, and then, solid phase polycondensation was performed to obtain about 400 kg of a powdery fully-aromatic thermotropic liquid crystal polyester (M-2). In the obtained fully-aromatic thermotropic liquid crystal polyester (M-2), no melting point was observed, and the obtained fully-aromatic thermotropic liquid crystal polyester (M-2) pyrolyzed without melting even when temperature was increased.

TABLE 3

| | Monomer composition (mole %) | | | | | | | | | Melting |
| | (1) HBA | (2)-1 TPA | (2)-2 IPA | (2)-3 NADC | (2)-4 BPDC | (3)-1 DHBP | (3)-2 Bis-S | (3)-3 Bis-A | (3)-4 BP | point (° C.) |
|---|---|---|---|---|---|---|---|---|---|---|
| Polyester A-2 | 72 | 10 | 4 | | | 3 | | | 11 | 335 |
| Polyester B-2 | 74 | 9 | 4 | | | 5 | | | 8 | 330 |
| Polyester C-2 | 74 | 9 | 4 | | | 0.5 | | | 12.5 | 358 |
| Polyester D-2 | 75 | 9.5 | 3 | | | 8 | | | 4.5 | 320 |
| Polyester E-2 | 66 | 16 | 2 | | | 6 | | | 11 | 325 |
| Polyester F-2 | 72 | 10 | | 4 | | 3 | | | 11 | 330 |
| Polyester G-2 | 72 | 10 | | | 4 | 3 | | | 11 | 332 |
| Polyester H-2 | 72 | 10 | 4 | | | | 3 | | 11 | 350 |
| Polyester I-2 | 74 | 9 | 4 | | | | | 0.5 | 12.5 | 358 |
| Polyester J-2 | 70 | 15 | | | | 15 | | | | 360 |
| Polyester K-2 | 60 | 15 | 5 | | | | | | 20 | 355 |
| Polyester L-2 | 60 | 15 | 5 | | | 20 | | | | 320 |
| Polyester M-2 | 80 | 5 | 5 | | | 5 | | | 5 | — |

In Table 3, HBA represents p-hydroxybenzoic acid, TPA represents terephthalic acid, IPA represents isophthalic acid, NADC represents 2,6-naphthalenedicarboxylic acid, BPDC represents 4,4'-biphenyldicarboxylic acid, DHBP represents 4,4'-dihydroxybenzophenone, Bis-S represents bisphenol-S, Bis-A represents bisphenol-A, and BP represents 4,4'-dihydroxybiphenyl.

The melting point of the fully-aromatic thermotropic liquid crystal polyesters was measured by the same method as the above.

<Titanium Oxide Particles>

A trade name "SR-1" (primary particle diameter: 0.25 μm) manufactured by Sakai Chemical Industry Co., Ltd. was prepared.

<Glass Fibers>

"PX-1" (average fiber length: 3 mm, average diameter: 10 μm) manufactured by OWENS CORNING was prepared.

Production of Resin Compositions

Example 8

100 Parts by mass of titanium oxide particles (SR-1, manufactured by Sakai Chemical Industry Co., Ltd.) were previously mixed with 100 parts by mass of the fully-aromatic thermotropic liquid crystal polyester (A-2) obtained above, and the mixture was dried in an air oven at 150° C. for 2 hours. This dried mixture was fed to the hopper of a twin screw extruder (KTX-46, manufactured by Kobe Steel, Ltd.) set at the highest temperature of a cylinder, 370° C., 22 parts by mass of glass fibers (PX-1, manufactured by OWENS CORNING) were further fed (side-fed) to the middle of the cylinder of the twin screw extruder, and the mixture was melted and kneaded at an extrusion rate of 160 kg/hr to obtain pellets of a fully-aromatic thermotropic liquid crystal polyester resin composition.

Examples 9 to 17

Pellets of fully-aromatic thermotropic liquid crystal polyester resin compositions were respectively obtained by the same equipment and operation method as in Example 8 except that the fully-aromatic thermotropic liquid crystal polyesters (B-2) to (J-2) were used instead of the fully-aromatic thermotropic liquid crystal polyester (A-2), and the components were mixed so as to provide compositions shown in Table 4 (the compositions in the table indicate parts by mass).

Comparative Examples 4 and 5

Pellets of fully-aromatic thermotropic liquid crystal polyester resin compositions were respectively obtained by the same equipment and operation method as in Example 8 except that the fully-aromatic thermotropic liquid crystal polyesters (K-2) and (L-2) were used instead of the fully-aromatic thermotropic liquid crystal polyester (A-2), and the components were mixed so as to provide compositions shown in Table 4 (the compositions in the table indicate parts by mass).

Comparative Example 6

An attempt was made to produce pellets of a fully-aromatic thermotropic liquid crystal polyester resin composition by the same equipment and operation method as in Example 8 except that the fully-aromatic thermotropic liquid crystal polyester (M-2) was used instead of the fully-aromatic thermotropic liquid crystal polyester (A-2) and the components were mixed so as to provide a composition shown in Table 4 (the compositions in the table indicate parts by mass), but the fully-aromatic thermotropic liquid crystal polyester (M-2) did not melt, and therefore, pellets could not be obtained.

<Fabrication of Test Pieces by Injection Molding Method>

The pellets of the resin compositions obtained in the above Examples and Comparative Examples were injection-molded at a cylinder highest temperature of 350° C., an injection rate of 100 mm/sec, and a mold temperature of 80° C., using an injection molding machine (SG-25 manufactured by Sumitomo Heavy Industries, Ltd.), to fabricate 13 mm (width)× 130 mm (length)×3.0 mm (thickness) injection-molded objects. These were used as test pieces for the measurement of light reflectance. In addition, injection molding was performed under the same conditions as the above to fabricate flexural test pieces according to ASTM D790, and the flexural test pieces were used as test pieces for the measurement of distortion temperature under load (DTUL) and flexural modulus.

For the test pieces obtained above, initial light reflectance, light reflectance after a light irradiation test, distortion temperature under load, and flexural modulus were measured by the same methods as the above. Results are shown in Table 4. For Comparative Example 6 in which pellets were not obtained, evaluation tests were not performed. In addition, the complete melting temperature of the pellets of the resin compositions measured by the above method is also shown together in Table 4.

TABLE 4

|  |  | Fully-aromatic thermotropic liquid crystal polyester (parts by mass) | Titanium oxide particles (parts by mass) | Glass fibers (parts by mass) | Initial light reflectance %, 480 nm | Light reflectance after light irradiation test %, 480 nm | Complete melting temperature (° C.) | Distortion temperature under load DTUL (° C.) | Flexural modulus (GPa) |
|---|---|---|---|---|---|---|---|---|---|
| Example 8 | A-2 | 100 | 100 | 22 | 86 | 80 | 340 | 270 | 15.8 |
| Example 9 | B-2 | 100 | 100 | 22 | 87 | 82 | 330 | 266 | 14.5 |
| Example 10 | C-2 | 100 | 100 | 22 | 87 | 80 | 360 | 273 | 16.5 |
| Example 11 | D-2 | 100 | 100 | 22 | 85 | 81 | 320 | 260 | 16.1 |
| Example 12 | E-2 | 100 | 100 | 22 | 86 | 80 | 330 | 252 | 15.8 |
| Example 13 | F-2 | 100 | 100 | 22 | 86 | 80 | 330 | 255 | 16.0 |
| Example 14 | G-2 | 100 | 100 | 22 | 87 | 81 | 350 | 258 | 15.6 |
| Example 15 | H-2 | 100 | 100 | 22 | 86 | 80 | 360 | 260 | 15.5 |
| Example 16 | I-2 | 100 | 100 | 22 | 87 | 80 | 360 | 267 | 16.2 |
| Example 17 | J-2 | 100 | 100 | 22 | 83 | 80 | 370 | 220 | 10.1 |
| Comparative Example 4 | K-2 | 100 | 100 | 22 | 86 | 69 | 360 | 266 | 12.5 |
| Comparative Example 5 | L-2 | 100 | 100 | 22 | 78 | 76 | 320 | 185 | 9.0 |

TABLE 4-continued

| | Fully-aromatic thermotropic liquid crystal polyester (parts by mass) | Titanium oxide particles (parts by mass) | Glass fibers (parts by mass) | Initial light reflectance %, 480 nm | Light reflectance after light irradiation test %, 480 nm | Complete melting temperature (° C.) | Distortion temperature under load DTUL (° C.) | Flexural modulus (GPa) |
|---|---|---|---|---|---|---|---|---|
| Comparative Example 6 | M-2 | — | — | — | — | — | — | — |

It was found that all of the resin compositions of Examples 8 to 17 obtained by using the fully-aromatic thermotropic liquid crystal polyesters A-2 to J-2, in which the content of p-hydroxybenzoic acid (HBA) was in the range of 65 to 78 mole % and which comprised 0.5 mole % to 15 mole % of one of 4,4'-dihydroxybenzophenone (DHBP), bisphenol-S (Bis-S), and bisphenol-A (Bis-A), as a component corresponding to formula (3-1), had a complete melting temperature of 380° C. or less and were capable of being injection-molded at 380° C. or less, and as shown in Table 4, all of the initial light reflectance of the molded articles for 480 nm light was as high as 80% or more, and the light reflectance after the 500 hour light irradiation test decreased only by 3 to 7% with respect to the initial light reflectance and maintained a high level of 80% or more. In addition, no discoloration of the molded object surfaces was seen. Further, it was confirmed that all of the injection-molded objects obtained from the resin compositions of Examples 8 to 17 had a distortion temperature under load (DTUL) of 220° C. or more and a flexural modulus as high as 10 GPa or more, having a high degree of heat resistance capable of withstanding solder reflow, and mechanical properties.

On the other hand, in the resin composition of Comparative Example 4 obtained by using the fully-aromatic thermotropic liquid crystal polyester K-2 in which the content of HBA was 60 mole %, less than the range of the present invention, and which did not comprise a component corresponding to formula (3-1), the initial light reflectance was 80% or more, but the light reflectance after 500 hour light irradiation decreased by as much as 17% from the initial light reflectance and was less than 70%. In addition, in the resin composition of Comparative Example 5 obtained by using the fully-aromatic thermotropic liquid crystal polyester L-2 in which the content of HBA was 60 mole %, less than the range of the present invention, and the DHBP of the component corresponding to formula (3-1) was more than 20 mole %, the initial light reflectance was 78% and was lower than that of the resin compositions of the Examples, and a decrease in light reflectance after 500 hour light irradiation was small, but the DTUL was as low as 185° C., and the flexural modulus was also low, and heat resistance and mechanical properties were insufficient. In addition, the fully-aromatic thermotropic liquid crystal polyester M-2 in which the content of HBA was 80 mole %, more than the upper limit of the range of the present invention, did not melt even when it was heated, and a resin composition could not be produced.

As shown by the above Examples, it has been found that the fully-aromatic thermotropic liquid crystal polyester resin composition according to the present invention can be molded at 380° C. or less, and in a molded object of the resin composition, not only initial light reflectance is high, but also light reflectance is less likely to decrease also after long time light irradiation. In addition, it has been found that the fully-aromatic thermotropic liquid crystal polyester resin composition according to the present invention has heat resistance withstanding solder reflow, and also has good mechanical properties.

INDUSTRIAL APPLICABILITY

According to the present invention, it is possible to provide a fully-aromatic thermotropic liquid crystal polyester resin composition that provides a molded article that has optical properties which provide sufficiently high light reflectance and in which discoloration due to light irradiation is little and light reflectance is less likely to decrease, and excellent heat resistance withstanding solder reflow, and excellent mechanical properties. In addition, the resin composition of the present invention is also excellent in moldability, and can be subjected to molding processing at 380° C. or less, and by using the surface of the molded article as a reflective surface, an LED reflector in which light reflectance is high, a decrease in light reflectance is small also after light irradiation, and good light reflectance can be maintained can be obtained.

The invention claimed is:

1. A fully-aromatic thermotropic liquid crystal polyester resin composition comprising:
   100 parts by mass of a filly-aromatic thermotropic liquid crystal polyester; and
   50 to 150 parts by mass of titanium oxide, wherein
   the fully-aromatic thermotropic liquid crystal polyester comprises a repeating structural unit represented by the following formula (1), a repeating structural unit represented by the following formula (2), and a repeating structural unit represented by the following formula (3), and comprises 65 mole % to 78 mole % of the repeating structural unit represented by the formula (1), wherein chemical formula (1), (2), and (3) are:

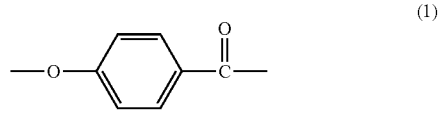

wherein X and Y each represent a divalent group having an aromatic ring.

2. The fully-aromatic thermotropic liquid crystal polyester resin composition according to claim 1, wherein the repeating structural unit represented by the formula (2) is a residue of terephthalic acid and/or isophthalic acid, and the repeating structural unit represented by the formula (3) is a residue of 4,4'-dihydroxybiphenyl.

3. The fully-aromatic thermotropic liquid crystal polyester resin composition according to claim 1, comprising at least 0.5 mole % to 17.5 mole % of a repeating structural unit represented by the following formula (3-1) as the repeating structural unit represented by the formula (3),

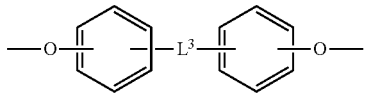
(3-1)

wherein $L^3$ represents a divalent hydrocarbon group, —$SO_2$—, or —CO—.

4. The fully-aromatic thermotropic liquid crystal polyester resin composition according to claim 3, wherein the fully-aromatic thermotropic liquid crystal polyester comprises at least 5 mole % to 17.5 mole % of a repeating structural unit represented by the following formula (2-1) as the repeating structural unit represented by the formula (2):

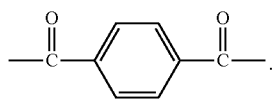
(2-1)

5. The fully-aromatic thermotropic liquid crystal polyester resin composition according to claim 3, wherein the fully-aromatic thermotropic liquid crystal polyester further comprises 2.5 mole % to 17 mole % of a repeating structural unit represented by the following formula (3-2) as the repeating structural unit represented by the formula (3):

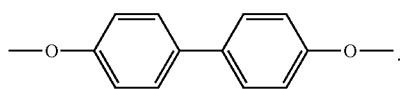
(3-2)

6. The fully-aromatic thermotropic liquid crystal polyester resin composition according to claim 3, wherein the fully-aromatic thermotropic liquid crystal polyester comprises at least 0.5 mole % to 15 mole % of a repeating structural unit represented by the following formula (3-3) and 2.5 mole % to 17 mole % of a repeating structural unit represented by the following formula (3-2) as the repeating structural unit represented by the formula (3):

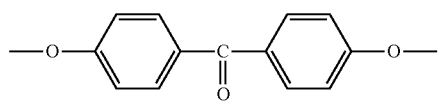
(3-3)

-continued

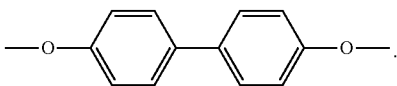
(3-2)

7. The fully-aromatic thermotropic liquid crystal polyester resin composition according to claim 1, wherein the fully-aromatic thermotropic liquid crystal polyester is obtained by two-stage polymerization of melt polycondensation and solid phase polycondensation.

8. The fully-aromatic thermotropic liquid crystal polyester resin composition according to claim 1, wherein a melting point of the fully-aromatic thermotropic liquid crystal polyester is 300° C. or more and 380° C. or less.

9. The fully-aromatic thermotropic liquid crystal polyester resin composition according to claim 1, wherein a complete melting temperature of the composition is 300° C. or more and 380° C. or less.

10. A molded object comprising the fully-aromatic thermotropic liquid crystal polyester resin composition according to claim 1.

11. An LED reflector comprising the fully-aromatic thermotropic liquid crystal polyester resin composition according to claim 1.

12. The fully-aromatic thermotropic liquid crystal polyester resin composition according to claim 4, wherein the fully-aromatic thermotropic liquid crystal polyester further comprises 2.5 mole % to 17 mole % of a repeating structural unit represented by the following formula (3-2) as the repeating structural unit represented by the formula (3):

(3-2)

13. The fully-aromatic thermotropic liquid crystal polyester resin composition according to claim 4, wherein the fully-aromatic thermotropic liquid crystal polyester comprises at least 0.5 mole % to 15 mole % of a repeating structural unit represented by the following formula (3-3) and 2.5 mole % to 17 mole % of a repeating structural unit represented by the following formula (3-2) as the repeating structural unit represented by the formula (3), (3-3)

(3-2)

* * * * *

UNITED STATES PATENT AND TRADEMARK OFFICE
CERTIFICATE OF CORRECTION

PATENT NO. : 8,715,526 B2
APPLICATION NO. : 13/583763
DATED : May 6, 2014
INVENTOR(S) : Toru Kitai et al.

It is certified that error appears in the above-identified patent and that said Letters Patent is hereby corrected as shown below:

In the Claims

At column 34, line 36 (claim 1, line 3), please change "filly-aromatic" to --fully-aromatic--.

At column 36, line 45 (claim 13, line 8), please change "formula (3)," to --formula (3):--.

Signed and Sealed this
Third Day of February, 2015

Michelle K. Lee
*Deputy Director of the United States Patent and Trademark Office*